United States Patent [19]

Mukawa et al.

[11] Patent Number: 4,488,061
[45] Date of Patent: Dec. 11, 1984

[54] DRIVE CIRCUIT

[75] Inventors: Tojiro Mukawa; Hatsuhide Igarashi, both of Tokyo, Japan

[73] Assignee: Nippon Electric Co., Ltd., Tokyo, Japan

[21] Appl. No.: 351,949

[22] Filed: Feb. 24, 1982

[30] Foreign Application Priority Data

Feb. 24, 1981 [JP] Japan ................... 56-25827

[51] Int. Cl.³ .............. H03K 5/02; H03K 17/10; H03K 17/693; H02M 3/155
[52] U.S. Cl. .................... 307/264; 307/270; 307/449; 307/578; 363/60; 381/120
[58] Field of Search ........... 307/449, 463, 482, 264, 307/270, 578; 363/59, 60; 365/230; 381/111, 107, 117, 120

[56] References Cited

U.S. PATENT DOCUMENTS

| | | | |
|---|---|---|---|
| 3,631,267 | 12/1971 | Heimbigner | 307/482 X |
| 3,988,617 | 10/1976 | Price | 307/482 X |
| 4,016,476 | 4/1977 | Morokawa et al. | 363/59 |
| 4,123,671 | 10/1978 | Aihara et al. | 307/264 X |
| 4,124,806 | 11/1978 | Rusznyak | 307/264 |
| 4,259,600 | 3/1981 | Fellrath et al. | 307/264 X |
| 4,382,194 | 5/1983 | Nakano et al. | 307/264 |
| 4,408,094 | 10/1983 | Oura | 381/120 |

OTHER PUBLICATIONS

Dickson, IEEE Journal of Solid-State Circuits, vol. SC-11, No. 3, pp. 374-378; 6/1976.

Primary Examiner—Larry N. Anagnos
Attorney, Agent, or Firm—Laff, Whitesel, Conte & Saret

[57] ABSTRACT

A drive circuit which can drive an IGFET in a non-saturated region over a long period time without reduction in level is disclosed. The drive circuit comprises a series circuit of a plurality of directional elements connected between a power supply terminal and an output terminal, a plurality of control terminals receiving repetitional signals and a plurality of capacitors coupled between the control terminals and intermediate junctions of the series circuit.

7 Claims, 9 Drawing Figures

DRIVE CIRCUIT

BACKGROUND OF THE INVENTION

This invention relates to a drive circuit, and more particularly to a drive circuit comprised of insulated gate field effect transistors.

Insulated gate field effect transistors (hereinafter referred to as the "IGFETs") have been widely employed as switching means because their conduction can be easily controlled by a voltage applied to their gates. When a power source voltage ($V_{DD}$) is operatively gated through the IGFET, it has been general that the IGFET is made conductive by a control signal having a level substantially equal to the power source voltage ($V_{DD}$). Consequently, the IGFET operates in the saturated region and the output level ($V_{out}$) outputted through the IGFET becomes a voltage lower than the power source voltage ($V_{DD}$) by the threshold voltage ($V_{th}$) of the IGFET. This relation is represented by the equation $V_{out} = V_{DD} - V_{th}$. If this output level ($V_{out}$) is used in order to drive another IGFET or other IGFETs of a subsequent stage circuit, the IGFET or IGFETs of the subsequent stage circuit receive a gate voltage of $V_{out}$ which is lower than the power source voltage ($V_{DD}$) to operate in the saturated region. As a result, the IGFETs of the subsequent stage circuit can not assume a sufficient conductive state. Therefore, the output currents gated through the IGFETs of the subsequent stage are limited to a relatively small value. In order to obtain a desired output current, therefore, physical dimensions of the IGFETs of the subsequent stage circuit must be made larger.

For avoiding this disadvantage, the so-called "bootstrap circuit" has been employed to drive the IGFET in the non-saturated region for drawing out sufficient output voltage or current. In this bootstrap circuit, a potential rising in response to an input signal is added to the electric charge stored in a capacitor to obtain a potential higher than the power source voltage ($V_{DD}$). Thus, the IGFET is driven in the non-saturated region by the higher potential. However, the potential stored across the capacitor decreases with time elapse due to leakage. It has therefore been difficult to maintain the higher potential throughout a relatively long time period. Furthermore, in the bootstrap circuit, the potential rising in response to the input signal is delayed with respect to the input signal at least by the period in which the capacitor is charged, and hence it has been difficult to attain high speed response.

In the field of digital audio which obtains an audio output signal on the basis of digital signal processing, the above-mentioned problem of the bootstrap circuit has become a serious problem. Namely, since audio signal contains a low frequency signal having a long cycle period, it is necessary to maintain the higher potential over the long cycle period. Accordingly, a reduction in level of the higher potential of the bootstrap circuit inevitably causes a reduction in level of the audio output signal. Furthermore, because the audio signal contains a variety of frequency components, response delay markedly deteriorates the reproduction of the signal waveform.

SUMMARY OF THE INVENTION

It is therefore an object of the present invention to provide a drive circuit which is capable of generating a high potential output for a long period.

It is another object of the present invention to provide a drive circuit with excellent response to the input signal.

The drive circuit in accordance with the present invention comprises a plurality of directional elements interposed between a first power source terminal and a first terminal so as to supply charge from the power source terminal to the first terminal; a plurality of capacitors, each having one end thereof connected to the intermediate junction between the directional elements; means for supplying periodic signals to the other end of each of the capacitors; a first IGFET connected between the first terminal and a second power source terminal; a second IGFET having a drain connected to the first power source terminal and a source connected to an output terminal; and means for connecting the first terminal to the gate of the second IGFET; wherein the output of a voltage value at the first power source terminal is taken out from the output terminal in accordance with the signal supplied to the input terminal.

In accordance with one aspect of the present invention, there is provided a transistor circuit which comprises a series of rectification elements including at least two rectification elements wherein one end of the series-connected rectification elements is connected to a first constant voltage power source or to the output terminal of a logic circuit using the first constant voltage power source as its power source; switch means connected to the other end of the series-connected rectification elements at one end and having the other end thereof at the same potential as a second constant voltage power source; at least one IGFET connected to the other end of the series of rectification elements; and a capacitor having one end connected to at least one intermediate junction of the series of rectification elements and the other end connected to an output terminal producing a repeatedly changing signal.

According to another aspect of the present invention, there is provided a drive circuit comprising a first voltage terminal, a second voltage terminal, a drive terminal, a series circuit of a plurality of directional elements coupled between the first voltage terminal and the drive terminal, each of the directional elements being connected so as to feed electric charge from the first voltage terminal towards the drive terminal, a plurality of capacitors each of the capacitors having a first terminal coupled to the associated one of intermediate junctions of the directional elements, a plurality of means each for supplying a second terminal of the associated one of the capacitors with a repetitional signal, an input terminal for receiving an input signal, a first insulated gate field effect transistor coupled between the drive terminal and the second voltage terminal, and means for connecting a gate of the first insulated gate field effect transistor, whereby a potential having a large value than that of a potential of the first voltage terminal is derived from the drive terminal in response to said input signal.

According to still another aspect of the present invention, there is provided a drive circuit comprising a first voltage generating circuit, a second voltage generating circuit, each of the first and second voltage generating circuits generating output voltages having a larger value than a power source voltage at their output terminal, means for receiving an input signal, first clamp means for clamping the potential at the output terminal of the first voltage generating circuit to a reference voltage when the input signal is present, second clamp means for clamping the potential at the output terminal of the second voltage generating circuit to the reference voltage when the input signal is absent, and a push-pull circuit controlled by the potentials of the output terminals of the first and second voltage generating circuits in a complementary manner.

DESCRIPTION OF THE PREFERRED EMBODIMENTS

First, an example of a conventional bootstrap circuit will be explained with reference to FIGS. 1 and 2. In the following, N channel IGFETs are employed and the potential of a power source ($V_D$) and the ground potential correspond to logic "1" and "0", respectively.

Figure 1:
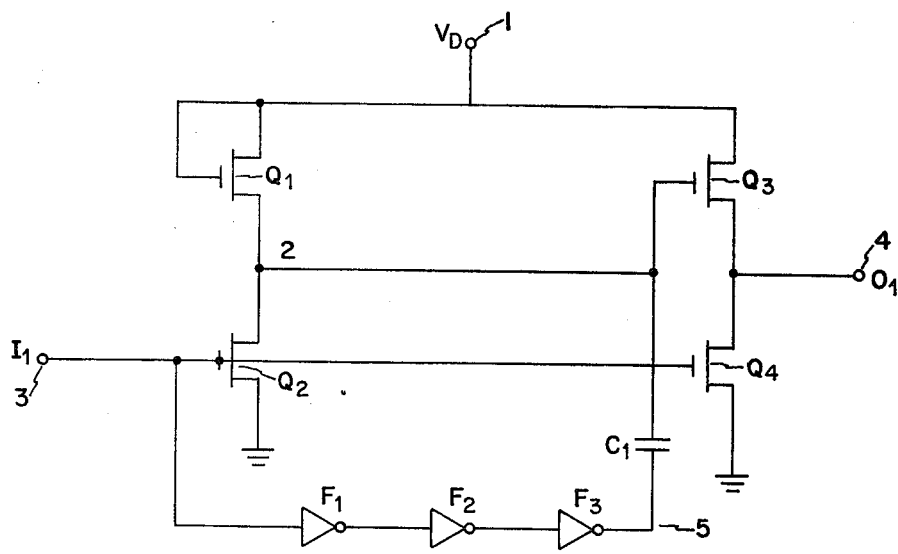
FIG. 1 is a circuit diagram of an example of the conventional output circuit.
Figure 2:
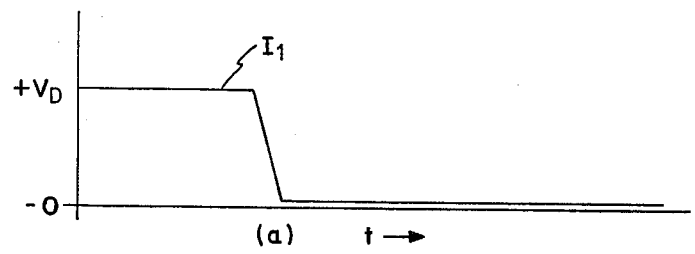
FIGS. 2(a) and 2(b) are time charts used to explain the operation the operation of the output circuit shown in FIG. 1.
Figure 2:
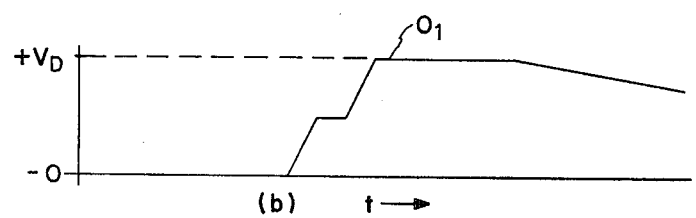

In FIG. 1, an output node 2 of an inverter consisting of an enhancement type IGFET $Q_1$ as a load element and an enhancement type IGFET $Q_2$ as a driving IGFET is connected to the gate of an IGFET $Q_3$ on the power source side and also to one terminal of a capacitor $C_1$ whose other end is connected to the output of a delay circuit consisting of three serially connected inverters $F_1$ to $F_3$.

FIGS. 2(a) and 2(b) are time charts for explaining the operation of the output circuit shown in FIG. 1.

When the potential $I_1$ of the input terminal 3 of the circuit shown in FIG. 1 changes from high level to low level as shown in FIG. 2(a), the potential at the output node 2 is pushed up to a level which is higher than the power source voltage $V_D$ by a bootstrap effect so that the potential $O_1$ at the output terminal 4 is raised to the voltage $V_D$.

However, the conventional circuit such as described above has the problem that the potential at the output node 2 tends to decrease in level and reaches a level insufficient to produce the $V_D$ potential at the output terminal 4, within about several milliseconds due to the leakage current.

Preferred embodiments of the present invention will be described with reference to the accompanying drawings. By way of example, all the IGFETs used herein are of an N-channel type.

The first embodiment of the invention will be described with reference to FIGS. 3 and 4.

This embodiment represents the application of the present invention to an inverter circuit.

IGFETs $Q_9$ and $Q_{10}$ together form the inverter circuit in which the IGFET $Q_9$ functions as the load. An IGFET $Q_{11}$ biases the gate of IGFET $Q_9$ so as to make it conductive.

A drive circuit 100 is comprised of serially connected IGFETs $Q_5$ to $Q_7$ as rectification (single directional) elements by connecting their gates to their drains in common, and is interposed in series between the power source terminal 10 ($V_D$) and a driving output terminal 15. In this case, IGFETs $Q_5$ to $Q_7$ are placed in such a direction as to feed the charge from the power source terminal 10 to the output terminal 15. A control IGFET $Q_8$ is interposed between the driving output terminal 15 and the ground potential (GND). The gate of this IGFET $Q_8$ is connected to a control signal ($I_2$) terminal 16. Here, the IGFET $Q_8$ is an enhancement type while IGFETs $Q_5$ to $Q_7$ are either enhancement type or depletion type having a threshold value near the zero potential.

One ends of capacitors $C_2$ and $C_3$ are connected to the intermediate junction 13 and 14 respectively of the series circuit of the IGFETs $Q_5$ to $Q_7$ while the other ends (11 and 12) of the capacitors receive clock signals $\phi$ and $\bar{\phi}$ as a repeatedly changing signals, respectively. Hence, the other ends 11 and 12 of the capacitors $C_2$ and $C_3$ are referred to as the "clock terminals". Here, the drive circuit 100 basically functions as an inverter that generates a voltage of substantially three times that of the power source voltage $V_D$.

Next, the operation of this embodiment will be described with reference to FIGS. 4(a) through 4(d).

When the clock signals $\phi$ and $\bar{\phi}$ are applied to the clock terminals 11 and 12, respectively, the potentials at the junctions 13 and 14 are raised by capacitors $C_2$ and $C_3$ and reach potentials which are twice and three times the power source voltage ($V_D$), respectively. If the input terminal 16 which receives the input signal $I_2$, is at the high level, IGFETs $Q_8$ and $Q_{10}$ are conductive. Therefore, the driving output terminal 15 is at the low level. As a result, IGFET $Q_9$ is non-conductive, and the $O_2$ output terminal 17 is at the low level. When the input signal $I_2$ changes from the high level to the low level, IGFETs $Q_8$ and $Q_{10}$ become non-conductive. After being charged to a potential close to the power source voltage $V_D$ by IGFET $Q_{11}$, the driving output terminal 15 is gradually charged to a higher level in accordance with changes in the clock signals $\bar{\phi}$ and $\phi$ until the driving output terminal 15 reaches a potential of about 3 $V_D$. In this instance, the IGFET $Q_9$ is conductive in non-saturated region and the potential of the driving output terminal 15 to which the gate of the IGFET $Q_9$ is connected is kept charged so long as the clock signals are changing, so that a predetermined output impedance can be maintained. Since the gate voltage of IGFET $Q_9$ is higher than 2 $V_D$, low impedance can be maintained for the IGFET $Q_9$ even when the output terminal 17 reaches a potential close to the power source voltage $V_D$.

Figure 5:
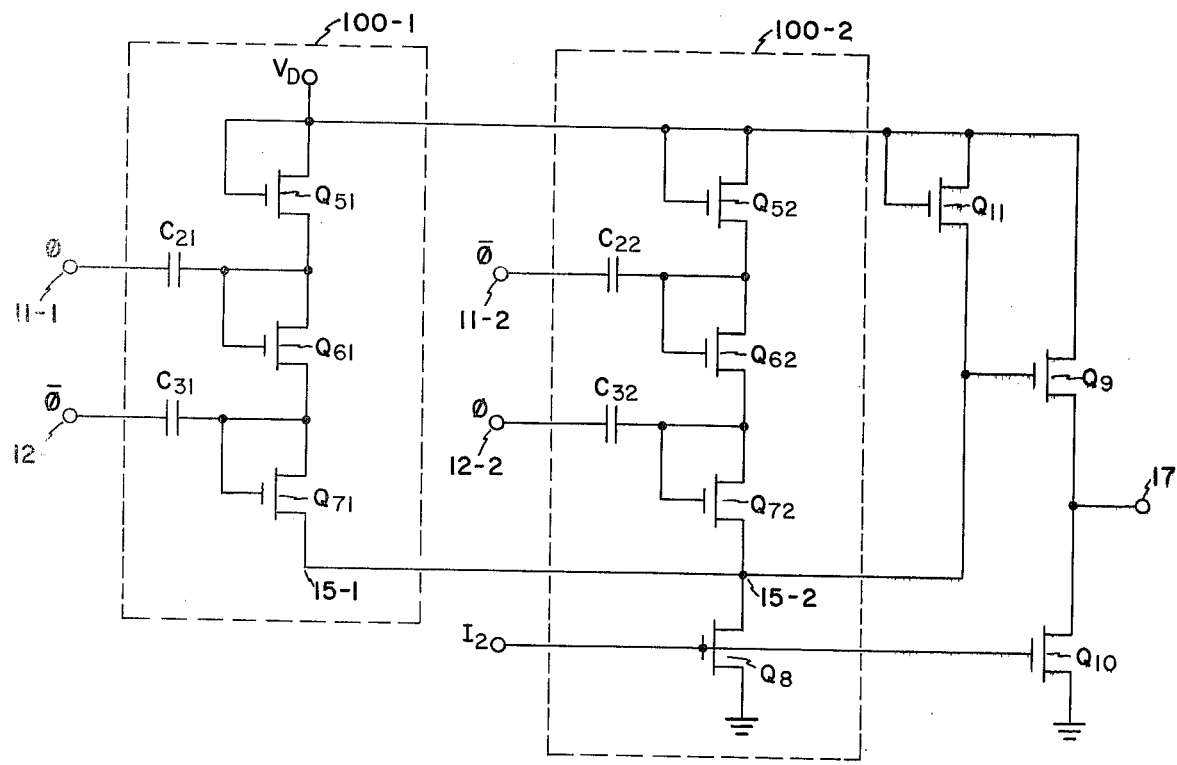
FIG. 5 is a circuit diagram of a second embodiment of the present invention.

The second embodiment of the present invention will now be described with reference to FIG. 5.

In this embodiment, driving output terminals 15-1 and 15-2 of two triple voltage generating circuits (generating voltages of 3 $V_D$) 100-1 and 100-2 are connected in parallel so as to control the gate potential of the IGFET $Q_9$ of the output inverter consisting of IGFETs $Q_9$ and $Q_{10}$. The clock signal $\emptyset$ is supplied to the terminal 11-1 of a capacitor $C_{21}$ of the circuit 100-1 while the clock signal $\overline{\emptyset}$ opposite in phase to $\emptyset$ is applied to a capacitor $C_{22}$ of the circuit 100-2. Similarly, the clock signal $\overline{\emptyset}$ is applied to the terminal 12-1 for the capacitor $C_{31}$ of the circuit 100-1 while the clock signal $\emptyset$ is applied to the terminal 12-2 for the capacitor $C_{13}$ of the circuit 100-2. Accordingly, the circuits 100-1 and 100-2 operate with the opposite phases with respect to each other, and pulsation of the high level output for IGFET $Q_9$ can be smoothed. Further, the driving impedance for the gate of IGFET $Q_9$ can also be reduced substantially by half and the response can be made at a high speed. This arrangement is able to drive not only a high impedance load but also a low impedance load.

Figure 6:
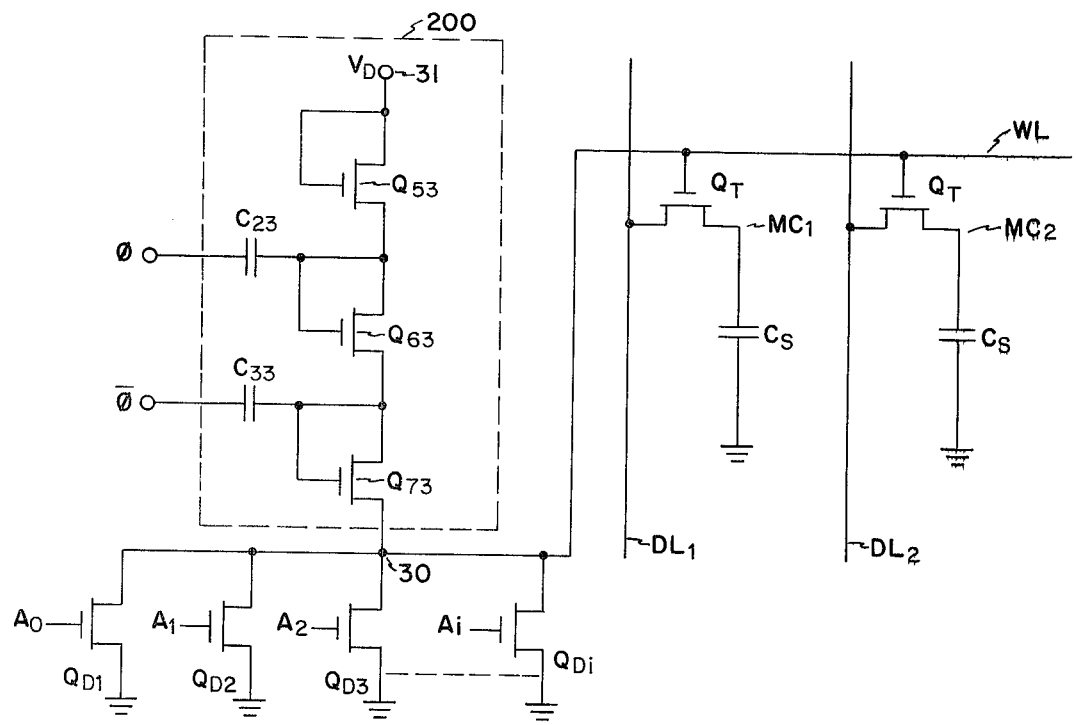
FIG. 6 is a circuit diagram of a third embodiment of the present invention.

Next, the third embodiment of the present invention will be described with reference to FIG. 6.

This embodiment illustrates the present invention applied to a decoding circuit for driving a word line of a memory.

A triple voltage generating circuit 200 (for generating three times the power source voltage) includes IGFETs $Q_{53}$, $Q_{63}$ and $Q_{73}$ having their gates connected in common to the drains, is interposed in series between the power source terminal 31 and the output terminal 30. Clock signals $\emptyset$ and $\overline{\emptyset}$ are applied to the drains of IGFETs $Q_{63}$ and $Q_{73}$, respectively via capacitors $C_{33}$ and $C_{24}$. A plurality of IGFETs $Q_{D1}$ through $Q_{Di}$ are interposed between the output terminal 30 and the ground potential in parallel with one another and address signals $A_0$, $A_1$, $A_2$, $A_i$ are applied to the gates of these IGFETs $Q_{D1}$ through $Q_{Di}$. Here, the IGFETs $Q_{D1}$ to $Q_{Di}$ and the circuit 200 basically form a NOR gate which functions as an address decoder. The output terminal 30 is connected to the word line WL of the memory. Digit lines $D_{L1}$ and $D_{L2}$ cross the word line WL and memory cells $MC_1$ and $MC_2$ are disposed at the points of intersection. The memory cell $MC_1$ consists of an IGFET $Q_T$ as a transfer gate whose gate is connected to the word line WL and a capacitor $C_S$ for storing the data. When the word line WL is to be selected in this memory, all the IGFETs $Q_{D1}$ through $Q_{Di}$ are turned off and a voltage of approximately 3 $V_D$ is provided to the word line WL. Accordingly, the IGFETs $Q_T$ of the memory cells become conductive in the non-saturated region and is capable of effectively transferring charge between the digit lines ($DL_1$, $DL_2$) and the capacitors $C_S$ without any level reduction.

Though this embodiment illustrates the technique for driving the word line of the memory employing one-transistor type memory cells, the present invention can likewise be applied to a memory such as a static type memory, or the like.

Figure 7:
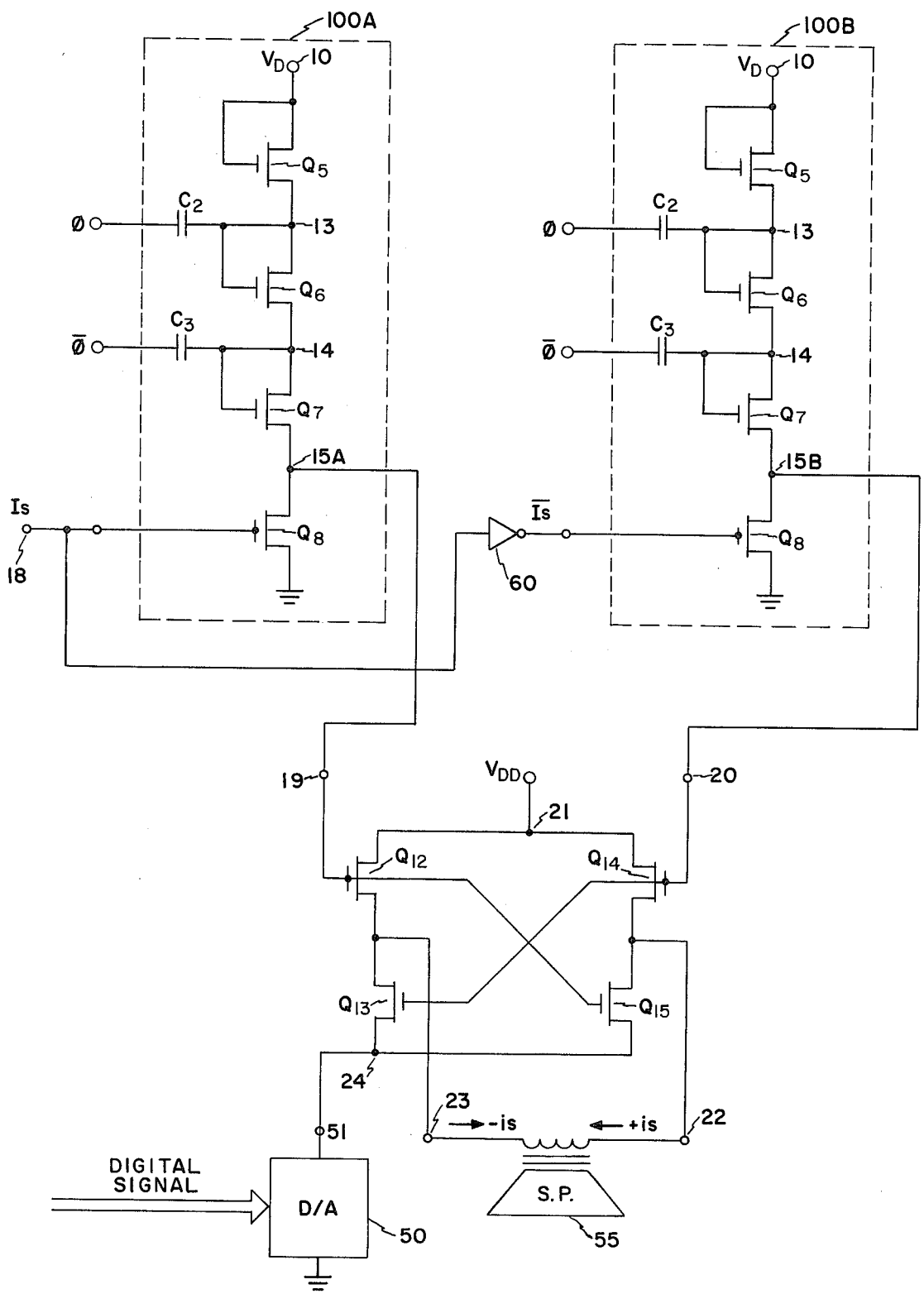
FIG. 7 is a circuit diagram of a fourth embodiment of the present invention.
Figure 8:
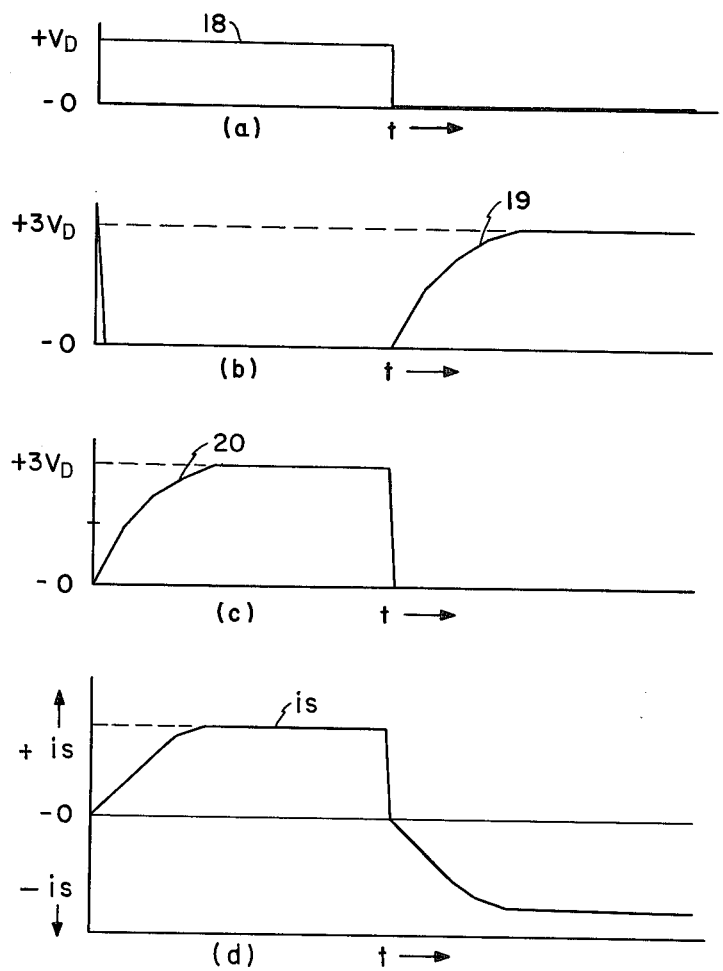
FIGS. 8(a) through 8(d) are time charts useful for explaining the operation of the second embodiment shown in FIG. 5.

The fourth embodiment of the present invention will now be described with reference to FIGS. 7 and 8.

This embodiment illustrates an example in which an acoustic transducer (speaker, in this embodiment) which is driven by A.C. current, is driven using two triple voltage generating inverters (for generating three times the power source voltage) 100A and 100B. The structures of the triple voltage generating inverters 100A and 100B are the same as that encompassed by broken lines in FIG. 3, and the output terminals 15A and 15B of these triple voltage generation inverters 100A and 100B correspond to the terminal 15 shown in FIG. 3.

IGFETs $Q_{12}$ and $Q_{13}$ form a first push-pull circuit for driving the speaker 55 and the output terminal of this circuit is connected to a terminal 23 of the speaker 55. IGFETs $Q_{14}$ and $Q_{15}$ form a second push-pull circuit for driving the speaker 55 and the output terminal of this circuit is connected to a terminal 22 of the speaker 55. The signal Is has frequency components of the audio signal and drives the circuit 100A. The signal $\overline{Is}$ is inverted by an inverter 60 and the inverted signal Is controls the circuit 100B complementarily to the circuit 100A. The outputs from the output terminals 15A and 15B of these two circuits are used to complementarily control the two push-pull circuits. The sources of two IGFETs $Q_{13}$ and $Q_{15}$ are connected to a current output terminal 51 of a D/A converter 50 which generates a current output in response to the input digital signal. The digital signal provides the amplitude component of the audio signal. Accordingly, the two push-pull circuits transform the output current of the D/A converter 50 to AC current form and drive a coil of the speaker 55 in accordance with the signal Is.

Here, the clock signals $\emptyset$ and $\overline{\emptyset}$ are sufficiently shorter than the period of the signal supplied to the Is code terminal 18. It is preferred that the period is greater by at least twice the maximum frequency of the signal Is.

The operation of the embodiment shown in FIG. 7 will be explained with reference to FIGS. 8(a) through 8(d).

When the signal Is changes from the low level to the high, the output terminal 15A changes to the low level and the output terminal 15B is charged to the high level and finally reaches a certain high level which is about 3 $V_D$. Accordingly, a current $+i_s$ flows from the speaker terminal 22 to 23.

Next, when the signal Is changes to the low level, the output terminal 15A is charged to about 3 $V_D$, while the output terminal 15B changes to the low level. In this case, a current $-i_s$ flows from speaker terminal 23 to 22. By driving the polarity change-over switch consisting of IGFETs $Q_{12}$ to $Q_{15}$ by the triple voltage generating inverters in this manner, it is possible to construct a speaker driving circuit having a low output impedance with reduced-sized IGFETs.

Figure 9:
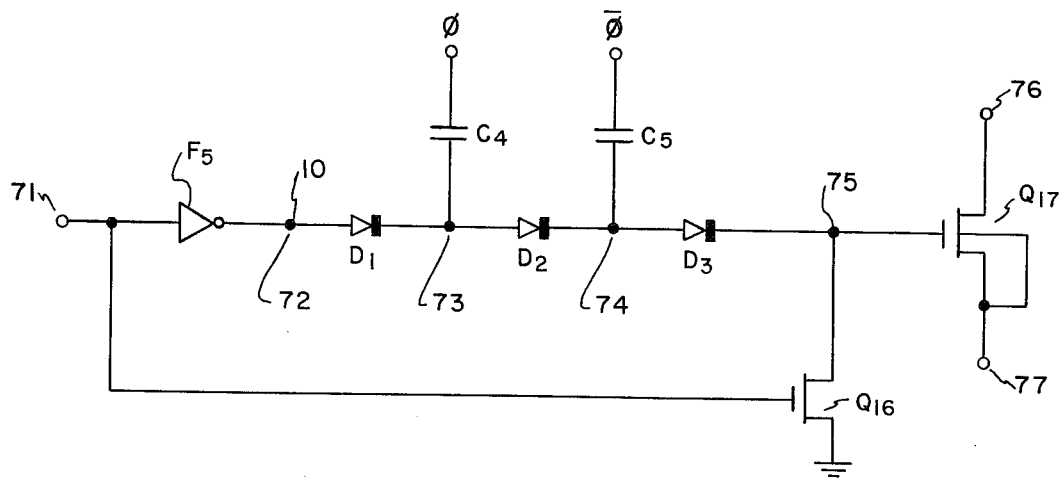
FIG. 9 is a circuit diagram of a fifth embodiment of the present invention.

FIG. 9 is a circuit diagram of a fifth embodiment of the present invention.

Figure 3:
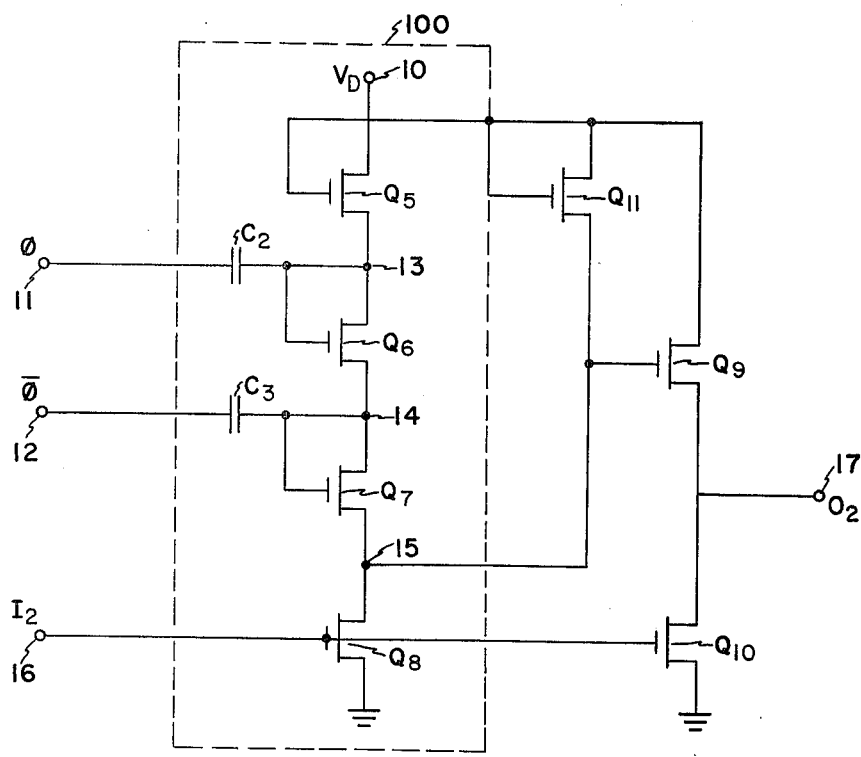
FIG. 3 is a circuit diagram of a first embodiment of the present invention.
Figure 4:
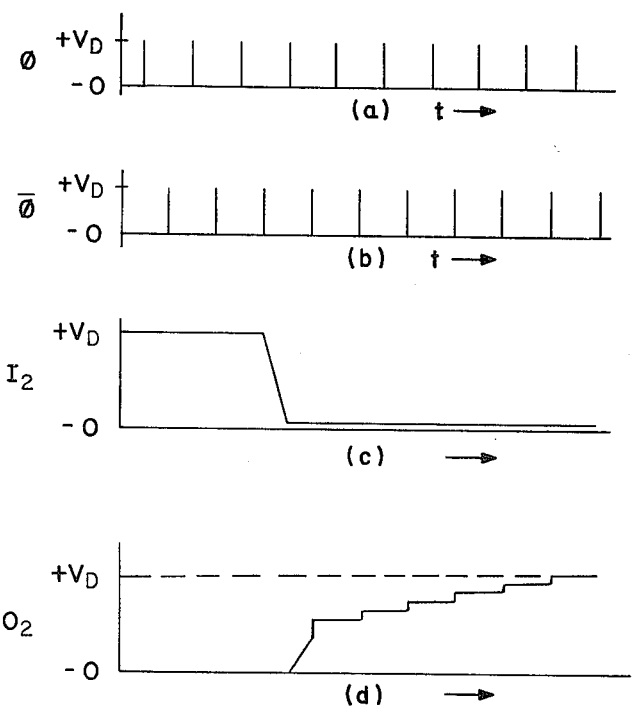
FIGS. 4(a) through 4(d) are time charts used to explain the operation of the first embodiment of the present invention.

Instead of the IGFETs $Q_5$ to $Q_7$ used in FIG. 3, diodes $D_1$, $D_2$ and $D_3$ are connected in series to form the series rectification element circuit. One end 72 of the series circuit and its other end 75 correspond to one end 10 and the other 15 in FIG. 3. IGFETs $Q_{16}$ and $Q_{17}$ correspond to the IGFETs $Q_8$ and $Q_9$ of FIG. 3, respectively. In other words, the IGFET $Q_{16}$ serves as the switching means. The drain terminal 76 of the IGFET $Q_{17}$ is connected to the power source $V_D$ or to the terminal of other circuits and the source terminal 77 functions as the output terminal. The one end 72 is connected to the output terminal of a logic circuit $F_5$. The input signal $I_2$ from the triple voltage generating inverter is applied to the input terminal 71 of the logic circuit $F_5$.

Capacitors $C_4$ and $C_5$ are connected to the junctions 73 and 74 of the series circuit and receive the repeatedly changing signals, that is, the clock signals $\emptyset$ and $\overline{\emptyset}$ in this embodiment.

The circuit constructed in this manner operates in the same way as the output circuit shown in FIG. 3.

In recent integrated circuits including silicon gate CMOS's, SOS, CMOS's and the like, diodes having a P-N junction of polycrystalline silicon or single crystal silicon can be formed while being isolated from the substrate. Hence, the circuit shown in FIG. 9 can be formed on the same substrate together with the other IGFET elements.

Although the foregoing embodiments employ N-channel IGFETs, the present invention can also be applied to semiconductor integrated circuits using P-channel IGFETs and to CMOS semiconductor integrated circuits.

In addition, though the foregoing embodiments have been described using triple voltage generating inverters, it would be obvious to those skilled in the art that 2 to n times voltage generating circuits (for generating a voltage of twice to n times $V_D$) can be similarly used.

As described in detail in the foregoing, the present invention provides the great advantage that an output circuit can be obtained which does not change the output voltage even when the output is kept constant for a long period.

We claim:

1. A drive circuit comprising a first voltage generating circuit means connected between a first voltage terminal and a voltage output terminal, a second voltage generating circuit means connected between said first voltage terminal and said voltage output terminal, said first voltage generating circuit means having at least a first and a second transistor each operating as a rectification element and being connected in series, a first capacitor connected to a point between said first and second transistors, said second voltage generating circuit means having a third and a fourth transistor each operating as a rectification element and being connected in series, a second capacitor connected to a point between said third and fourth transistors, means for supplying a first clock signal to said first capacitor, means for supplying a second clock signal to said second capacitor, said second clock signal having a phase which is different from the phase of said first clock signal, and a fifth transistor connected between said voltage output terminal and a second voltage terminal for receiving an input signal, whereby an output voltage is derived from said voltage output terminal, when said fifth transistor is made nonconductive, said output voltage being smoothed by said first and second voltage generating circuit means.

2. The circuit according to claim 1, further comprising a sixth transistor for receiving said input signal, a seventh transistor for receiving said output voltage derived from said voltage output terminal, said sixth and seventh transistors being connected in series between said first voltage terminal and said second voltage terminal, and an eighth transistor connected between said first voltage terminal and said voltage output terminal.

3. A drive circuit comprising a first voltage terminal, first, second and third field effect transistors coupled in series between said first voltage terminal and a first node, each of said first, second and third transistors having a gate and a drain connected in common, a first clock terminal for receiving a first clock signal, a second clock terminal for receiving a second clock signal having a phase which is different from the phase of said first clock signal, a first capacitor connected between said first clock terminal and a connection point of said first and second transistors, a second capacitor connected between said second clock terminal and a connection point between said second and third transistors, a second voltage terminal, an input terminal for receiving an input signal, a fourth field effect transistor connected between said first node and said second voltage terminal and having a gate connected to said input terminal, a fifth transistor connected between said first voltage terminal and said first node, an output terminal, a sixth transistor connected between said output terminal and said second voltage terminal and having a gate connected to said input terminal, and a seventh transistor connected between said first voltage terminal and said output terminal and having a gate connected to said first node.

4. A drive circuit comprising a first voltage generating circuit, a second voltage generating circuit, each of said first and second voltage generating circuits generating output voltages having a larger value than a power source voltage at their output terminal, means for receiving an input signal, first clamp means for clamping the potential at the output terminal of said first voltage generating circuit to a reference voltage when said input signal is present, second clamp means for clamping the potential at the output terminal of said second voltage generating circuit to said reference voltage when said input signal is absent, and a first push-pull circuit controlled by the potentials of the output terminals of said first and second voltage generating circuits in a complementary manner.

5. The circuit according to claim 4, further comprising a second push-pull circuit controlled by the potentials of the output terminals of said first and second voltage generating circuits in such a manner that an output signal of said second push-pull circuit is opposite in phase to that of said first push-pull circuit.

6. The circuit according to claim 3, further comprising an acoustic tranducer having a first terminal coupled to the output terminal of said first push-pull circuit and a second terminal coupled to the output terminal of said second push-pull circuit.

7. The circuit according to claim 4, in which each of said voltage generating circuits includes a series circuit of directional elements coupled between a terminal receiving the power supply voltage and the output terminal thereof, a plurality of clock terminals for receiving clock signals and a plurality of capacitors coupled between said clock terminals and intermediate junctions of said directional elements.

* * * * *